US012804797B2

(12) United States Patent
Gupta et al.

(10) Patent No.: US 12,804,797 B2
(45) Date of Patent: Nov. 17, 2026

(54) CUSTOMIZED MODULE FOR COOLING/HEATING HIGH POWER OPTICS MOUNTED INSIDE AN OUTDOOR ENCLOSURE

(71) Applicant: Ciena Corporation, Hanover, MD (US)

(72) Inventors: Chander Prakash Gupta, Gurugram (IN); Ranjeet Chaurasiya, Gurugram (IN); Mohd Nizam, Madiyaon (IN); Shubham Kumar, Ghaziabad (IN); Rampratap Mahawar, Gurugram (IN)

(73) Assignee: Ciena Corporation, Fulton, MD (US)

( * ) Notice: Subject to any disclaimer, the term of this patent is extended or adjusted under 35 U.S.C. 154(b) by 340 days.

(21) Appl. No.: 18/746,161

(22) Filed: Jun. 18, 2024

(65) Prior Publication Data

US 2025/0344312 A1 Nov. 6, 2025

(30) Foreign Application Priority Data

May 6, 2024 (IN) ............................. 202411035854

(51) Int. Cl.

| | |
|---|---|
| ***H05K 1/02*** | (2006.01) |
| ***H05K 7/20*** | (2006.01) |
| ***H10W 40/20*** | (2026.01) |

(52) U.S. Cl.

CPC ....... *H05K 1/0201* (2013.01); *H05K 7/20336* (2013.01); *H05K 7/2049* (2013.01); *H10W 40/20* (2026.01)

(58) Field of Classification Search

CPC .. G02B 6/4261; G02B 6/4292; G02B 6/4284; G02B 6/3897; G02B 6/4257; G02B 6/428; G02B 6/3814; G02B 6/4272; G02B 6/4219; H05K 7/2049; H05K 7/20418; H05K 1/0203; H05K 7/20409; H05K 2201/10121; H05K 1/0274; H05K 7/1427; H05K 7/20509; H05K 1/021; H05K 1/0201; H05K 1/141; H05K 1/181; H05K 1/182; H05K 7/1409; H05K 7/209;

(Continued)

(56) References Cited

U.S. PATENT DOCUMENTS 5,073,046 A * 12/1991 Edwards ................ G02B 6/389 385/92

7,019,974 B2 * 3/2006 Lee ........................... G06F 1/20 174/15.2

(Continued)

*Primary Examiner* — Michael A Matey

(74) *Attorney, Agent, or Firm* — Clements Bernard Walker; Christopher L. Bernard

(57) ABSTRACT

An outdoor telecommunications enclosure that includes a node module assembly that serves to receive, retain, and effectively cool/heat one or more pluggable optical modules (POMs). The node module assembly includes a printed circuit board (PCBA) including one or more POM cages that are pressed over a local heat spreader plate, one or more thermoelectric coolers (TECs) and/or heaters, and a vapor chamber (VC) thermally coupled to one or more heat pipes and a remote heat spreader plate. Movement of the PCBA and one or more POM cages towards/away from the local heat spreader plate and one or more TECs/heaters is enabled by a hinged lever and plunger mechanism that allows the one or more POMs to be inserted into/removed from the one or more POM cages without damaging the thermal contact interface between the components.

20 Claims, 16 Drawing Sheets

(58) Field of Classification Search

CPC ....... H05K 7/20336; G06F 1/20; G06F 1/206; H10W 40/60; H10W 40/20; H01R 13/62933; H01R 13/6595; H01R 12/722; H01R 13/6275; H01R 4/30; H01R 4/48; H04B 10/40; H04B 1/036; F28F 2275/08; F28F 3/02; F28F 3/00

See application file for complete search history.

(56) References Cited

U.S. PATENT DOCUMENTS

| | | | | |
|---|---|---|---|---|
| 7,229,221 | B2 * | 6/2007 | Ahrens | G02B 6/4246 385/92 |
| 7,529,094 | B2 * | 5/2009 | Miller | H01R 13/7172 165/185 |
| 8,830,679 | B2 * | 9/2014 | Scholeno | H01R 13/6595 174/16.3 |
| 8,911,244 | B2 * | 12/2014 | Elison | H05K 7/20409 439/137 |
| 9,144,178 | B2 * | 9/2015 | Arvelo | B23P 15/26 |
| 9,277,673 | B2 * | 3/2016 | Droesbeke | H05K 7/20154 |
| 9,668,378 | B2 * | 5/2017 | Phillips | H01R 24/60 |
| 10,091,911 | B2 * | 10/2018 | Kelty | G02B 6/4269 |
| 10,468,794 | B2 * | 11/2019 | Leigh | G02B 6/36 |
| 10,939,536 | B1 * | 3/2021 | O'Leary | E21B 33/0385 |
| 11,586,259 | B2 * | 2/2023 | Chia | H05K 7/20154 |
| 11,589,481 | B2 * | 2/2023 | Gupta | H05K 7/2049 |
| 12,147,084 | B2 * | 11/2024 | Myhre | G06F 1/203 |
| 2003/0161026 | A1 * | 8/2003 | Qin | G02B 6/4265 359/281 |
| 2006/0176666 | A1 * | 8/2006 | Saturley | G06F 1/20 361/679.46 |
| 2006/0291172 | A1 * | 12/2006 | Lee | G06F 1/20 361/719 |
| 2008/0175544 | A1 * | 7/2008 | Fujiwara | G02B 6/4292 385/77 |
| 2009/0015456 | A1 * | 1/2009 | Moore | H01Q 1/526 342/4 |
| 2009/0296350 | A1 * | 12/2009 | Oki | G02B 6/4201 361/709 |
| 2009/0296351 | A1 * | 12/2009 | Oki | G02B 6/4201 361/709 |
| 2013/0156385 | A1 * | 6/2013 | Ishigami | G02B 6/4269 385/92 |
| 2014/0170898 | A1 * | 6/2014 | Elison | H05K 7/20409 439/487 |
| 2014/0307389 | A1 * | 10/2014 | Arvelo | B21D 53/04 29/890.035 |
| 2015/0362686 | A1 * | 12/2015 | Wang | G02B 6/387 385/89 |
| 2016/0238805 | A1 * | 8/2016 | McColloch | G02B 6/4268 |
| 2017/0027083 | A1 * | 1/2017 | Bai | H05K 7/20672 |
| 2019/0045656 | A1 * | 2/2019 | Chen | G06F 1/206 |
| 2020/0100379 | A1 * | 3/2020 | O'Leary | H05K 7/1409 |
| 2020/0100386 | A1 * | 3/2020 | Saturley | G02B 6/4269 |
| 2020/0260615 | A1 * | 8/2020 | Leigh | G06F 1/187 |
| 2021/0132311 | A1 * | 5/2021 | Shearman | G02B 6/4261 |
| 2021/0325616 | A1 * | 10/2021 | Lands | G02B 6/4269 |
| 2022/0003946 | A1 * | 1/2022 | Edwards, Jr. | G02B 6/4268 |
| 2022/0167493 | A1 * | 5/2022 | Hashimoto | G02B 6/4268 |
| 2022/0196923 | A1 * | 6/2022 | O'Leary | G02B 6/3883 |
| 2022/0302645 | A1 * | 9/2022 | Zhou | G02B 6/4246 |
| 2022/0304193 | A1 * | 9/2022 | Shearman | H05K 7/2039 |
| 2023/0039781 | A1 * | 2/2023 | Mohajer | H05K 7/20254 |
| 2023/0156900 | A1 * | 5/2023 | Cavallaro | G06F 1/203 361/679.54 |
| 2023/0375793 | A1 * | 11/2023 | Winzer | G02B 6/428 |
| 2023/0378686 | A1 * | 11/2023 | Bucher | G06F 1/20 |
| 2023/0397376 | A1 * | 12/2023 | Heydari | H05K 7/20509 |
| 2025/0258349 | A1 * | 8/2025 | Mahawar | G02B 6/3576 |

* cited by examiner

CUSTOMIZED MODULE FOR COOLING/HEATING HIGH POWER OPTICS MOUNTED INSIDE AN OUTDOOR ENCLOSURE

CROSS-REFERENCE TO RELATED APPLICATION

The present disclosure claims the benefit of priority of co-pending Indian patent application Ser. No. 202411035854, filed on May 6, 2024, and entitled "Customized Module for Cooling/Heating High Power Optics Mounted Inside an Outdoor Enclosure," the contents of which are incorporated in full by reference herein.

TECHNICAL FIELD

The present disclosure relates generally to the optical networking and telecommunications fields. More particularly, the present disclosure relates to a customized module for cooling/heating high power commercial grade optics mounted inside an outdoor enclosure in extended ambient temperature conditions without the use of fans.

BACKGROUND

Currently, related to outdoor telecommunications products, it is possible to cool about 6.5 W from high power optics using natural convection in ambient temperatures of between −40 and +60 degrees C. This limits the longer distance data transfer functionality of such outdoor telecommunications products. Further, the pluggable optics and heatsinks/chassis used typically utilize a dry sliding interface, which can become damaged with pluggable optical module (POM) insertion and removal, thereby adding thermal resistance between such pluggable optics and heatsinks/chassis.

The present background is provided as environmental context only. It will be readily apparent to those of ordinary skill in the art that the principles and concepts of the present disclosure may be implemented in other environmental contexts equally, without limitation.

BRIEF SUMMARY

The present disclosure provides an outdoor telecommunications enclosure that includes a node module assembly that serves to receive, retain, and effectively cool/heat one or more POMs, such as one or more quad small form factor pluggable double density (QSFP-DD) modules or the like. The node module assembly includes a printed circuit board (PCBA) including one or more 25 W POM cages or the like that are pressed over a local heat spreader plate, one or more thermoelectric coolers (TECs), and a vapor chamber (VC) thermally coupled to one or more heat pipes and a remote heat spreader plate. Movement of the PCBA and one or more POM cages towards/away from the local heat spreader plate and one or more TECs is enabled by a hinged lever and plunger mechanism that allows the one or more POMs to be inserted into/removed from the one or more POM cages without damaging the thermal contact interface between the components. In an actuated configuration, the PCBA and one or more POM cages are spring biased towards the local heat spreader plate and one or more TECs to enhance this thermal contact interface via conduction. Thus, the PCBA and one or more POM cages are translated towards/away from the local heat spreader plate by the hinged lever and plunger mechanism along an axis disposed perpendicular to a top/bottom/side surface (as opposed to an end surface) of the one or more POMs.

The node module assembly of the present disclosure allows the cooling of high power optics, 6.5 W and above—for example, 25 W in the present disclosure, as well as heating of such high power optics in low ambient temperature (<0 degrees C., for example), all by means of natural convection, without the use of fans. The node module assembly takes advantage of a spring loaded lever mechanism that presses the PCBA and the one or more POM cages into the local heat spreader plate, one or more TECs, and VC with an optimized predetermined spring force. Movement of the lever mechanism is restricted when lifted by an operator. The spring loaded lever provides thermal pressure contact between the optics and the ruggedized heat spreader to transfer heat during operation. When the lever is lifted, the thermal interface material (TIM) on heat spreader is moved away from the optics. This avoids scrubbing of the optics with the TIM during insertion/removal of the optics. The PCBA that includes the one or more POM cages is spring loaded and lifts away from the one or more TECs when the spring loaded lever is manually actuated upwards. When lever is released, the PCBA and one or more POM cages return to their operation positions. Thus, a gap is created between the optics and the local heat spreader during insertion/removal of the optics and the TIM will not tear or abrade. The one or more TECs are sandwiched between the local heat spreader and the ruggedized VC with optimized spring pressure. This is not impacted by the spring loaded lever during insertion/removal of the optics. The mechanism is placed over the VC to spread heat quickly and effectively to the chassis. The VC includes a mechanism to mount additional units to transfer and dissipate heat to other parts of the enclosure, including the 8 mm heat pipes or the like. A spring biased plunger in front of each of the one or more cages prevents inserting the optics unless the operator lifts the lever. The plungers rest over the optics post insertion utilizing plastic caps or the like, affixed to the optics using double sided tape or the like. The plungers prevent removal of the optics until the operator lifts the spring loaded mechanisms.

The ruggedized VC, which acts as a heat spreader above 0 degrees C., freezes below 0 degrees C. and behaves as heat insulator. In such situations, a heater over the local spreader plate heats the optics quickly and efficiently, as no or little heat transfers to the outdoor enclosure. An intelligent closed loop power controller is used for the one or more TECs based on the temperature of the optics for the entire ambient range. On the module, the full TEC controller uses two wire communication from a main processor.

In one embodiment, the present disclosure provides a node module assembly adapted to be disposed in a chassis enclosure, the node module assembly including: a vapor chamber; a local heat spreader plate disposed adjacent and thermally coupled to the vapor chamber; one or more of a thermoelectric cooler and a heater disposed between and thermally coupled to the local heat spreader plate and the vapor chamber; a printed circuit board disposed adjacent to the local heat spreader plate opposite the vapor chamber; a pluggable optical mode cage coupled to the printed circuit board and disposed between the local heat spreader plate and the printed circuit board, where the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage; where, when the lever mechanism translates the printed circuit board and the pluggable optical module cage towards the local heat spreader plate, the local heat spreader plate is thermally coupled to the pluggable optical module received in the pluggable optical module cage. The vapor chamber is adapted to function as a heat spreader at an elevated ambient temperature and an insulator at an ambient temperature below freezing. The vapor chamber is thermally coupled to one or more heat pipes thermally coupled to a remote heat spreader thermally coupled to the chassis enclosure adjacent to the node module assembly. The one or more of the thermoelectric cooler and the heater are disposed within a recess formed in the local heat spreader plate. The thermoelectric cooler is adapted to function in one of a cooling mode to cool the pluggable optical module received in the pluggable optical module cage and a heating mode adapted to heat the pluggable optical module received in the pluggable optical module cage. The printed circuit board is biased away from the local heat spreader plate. The lever mechanism is biased towards the local heat spreader plate and is adapted to bias the printed circuit board towards the local heat spreader plate. The local heat spreader plate includes a protruding pad that is adapted to thermally contact the pluggable optical module received in the pluggable optical module cage when the lever mechanism translates the printed circuit board and the pluggable optical module cage towards the local heat spreader plate. The protruding pad includes a thermal interface material that is adapted to thermally and physically contact the pluggable optical module received in the pluggable optical module cage. The lever mechanism includes a plunger assembly that is adapted to physically contact the pluggable optical module received in the pluggable optical module cage when the lever mechanism translates the printed circuit board and the pluggable optical module cage towards the local heat spreader plate, where the plunger assembly is biased towards the pluggable optical module received in the pluggable optical module cage. The node module assembly further includes a cover disposed about the local heat spreader plate, the printed circuit board, the pluggable optical mode cage, and the lever mechanism, where the cover defines a first opening for providing access to a first arm member of the lever mechanism by which an operator can actuate the lever mechanism to translate the printed circuit board and the pluggable optical module cage away from the local heat spreader plate and a second opening for providing access to the pluggable optical module cage for insertion and removal of the pluggable optical module.

In another embodiment, the present disclosure provides a chassis enclosure for telecommunications equipment, the chassis enclosure including: an enclosure member; and a node module assembly coupled to the enclosure member and disposed in the chassis enclosure, the node module assembly including: a vapor chamber; a local heat spreader plate disposed adjacent and thermally coupled to the vapor chamber; one or more of a thermoelectric cooler and a heater disposed between and thermally coupled to the local heat spreader plate and the vapor chamber; a printed circuit board disposed adjacent to the local heat spreader plate opposite the vapor chamber; a pluggable optical mode cage coupled to the printed circuit board and disposed between the local heat spreader plate and the printed circuit board, where the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage; where, when the lever mechanism translates the printed circuit board and the pluggable optical module cage towards the local heat spreader plate, the local heat spreader plate is thermally coupled to the pluggable optical module received in the pluggable optical module cage. The vapor chamber is adapted to function as a heat spreader at an elevated ambient temperature and an insulator at an ambient temperature below freezing. The vapor chamber is thermally coupled to one or more heat pipes thermally coupled to a remote heat spreader thermally coupled to the enclosure member adjacent to the node module assembly. The thermoelectric cooler is adapted to function in one of a cooling mode to cool the pluggable optical module received in the pluggable optical module cage and a heating mode adapted to heat the pluggable optical module received in the pluggable optical module cage. The printed circuit board is biased away from the local heat spreader plate; and the lever mechanism is biased towards the local heat spreader plate and is adapted to bias the printed circuit board towards the local heat spreader plate. The local heat spreader pad includes a protruding pad including a thermal interface material that is adapted to thermally and physically contact the pluggable optical module received in the pluggable optical module cage when the lever mechanism translates the printed circuit board and the pluggable optical module cage towards the local heat spreader plate. The lever mechanism includes a plunger assembly that is adapted to physically contact the pluggable optical module received in the pluggable optical module cage when the lever mechanism translates the printed circuit board and the pluggable optical module cage towards the local heat spreader plate, where the plunger assembly is biased towards the pluggable optical module received in the pluggable optical module cage.

In a further embodiment, the present disclosure provides a method for cooling or heating a pluggable optical module disposed in a chassis enclosure, the method including: providing a node module assembly disposed in the chassis enclosure, the node module assembly including: a vapor chamber; a local heat spreader plate disposed adjacent and thermally coupled to the vapor chamber; one or more of a thermoelectric cooler and a heater disposed between and thermally coupled to the local heat spreader plate and the vapor chamber; a printed circuit board disposed adjacent to the local heat spreader plate opposite the vapor chamber; a pluggable optical mode cage coupled to the printed circuit board and disposed between the local heat spreader plate and the printed circuit board, where the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage; and releasing the lever mechanism to translate the printed circuit board and the pluggable optical module cage towards the local heat spreader plate, the local heat spreader plate thereby being thermally coupled to the pluggable optical module received in the pluggable optical module cage. At an elevated ambient temperature, the vapor chamber functions as a heat spreader and, at an ambient temperature below freezing, the vapor chamber functions as an insulator; and, at the elevated ambient temperature, the thermoelectric cooler functions to cool the pluggable optical module received in the pluggable optical module cage and, at the ambient temperature below freezing, the one or more of the thermoelectric cooler and the heater function to heat the pluggable optical module received in the pluggable optical module cage.

It will be readily apparent to those of ordinary skill in the art that aspects and features of each of the described embodiments may be incorporated, omitted, and/or combined as desired in a given application, without limitation.

BRIEF DESCRIPTION OF THE DRAWINGS

The present disclosure is illustrated and described with reference to the various drawings, in which like reference numbers are used to denote like system components/method steps, as appropriate, and in which.

It will be readily apparent to those of ordinary skill in the art that aspects and features of each of the illustrated embodiments may be incorporated, omitted, and/or combined as desired in a given application, without limitation.

DETAILED DESCRIPTION

Figure 1:
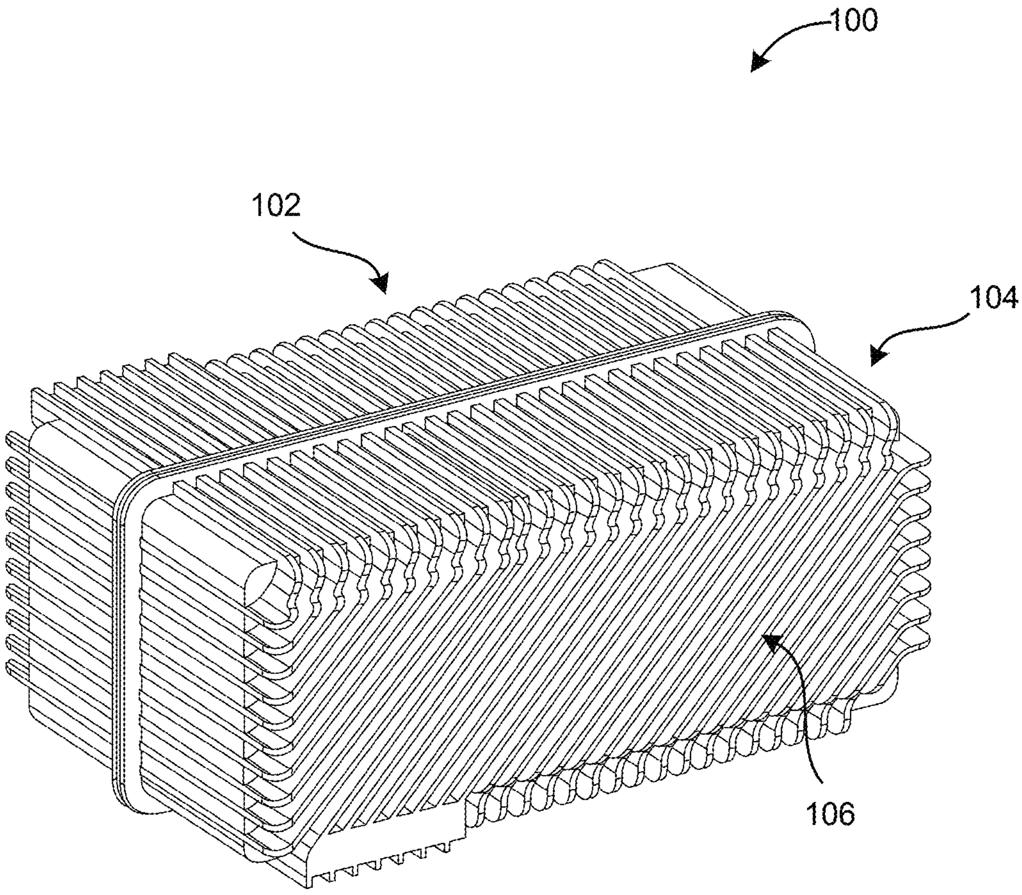
FIG. 1 illustrates one embodiment of the outdoor enclosure assembly of the present disclosure.

FIG. 1 illustrates one embodiment of the outdoor enclosure assembly 100 of the present disclosure, which includes a first enclosure member 102 (i.e., a lid) and a second enclosure member 104 (i.e., a base). This outdoor enclosure member 100 is used to enclose telecommunications components in a sealed and protected manner in an outdoor environment, although a less robust indoor enclosed member used in an indoor environment can be similarly configured. Although a first enclosure member 102 and a second enclosure member 104 are provided, fewer or more members may also be utilized. The outdoor enclosure member 100 includes a plurality of fins 106 or other heat dissipation structures adapted to circulate heat to/from the surrounding environment. Thus, the present disclosure provides a mechanism to dissipate power (up to 25 W, or exceeding 25 W) from high power optics localized within a relatively small enclosure, supporting high transfer rate transceivers using natural convection, without the use of fans. This allows increasing data transfer rates to be achieved, while addressing thermal (i.e., heating and cooling) issues. The mechanism incorporates TECs with mechanical and thermal elements.

Figure 2:
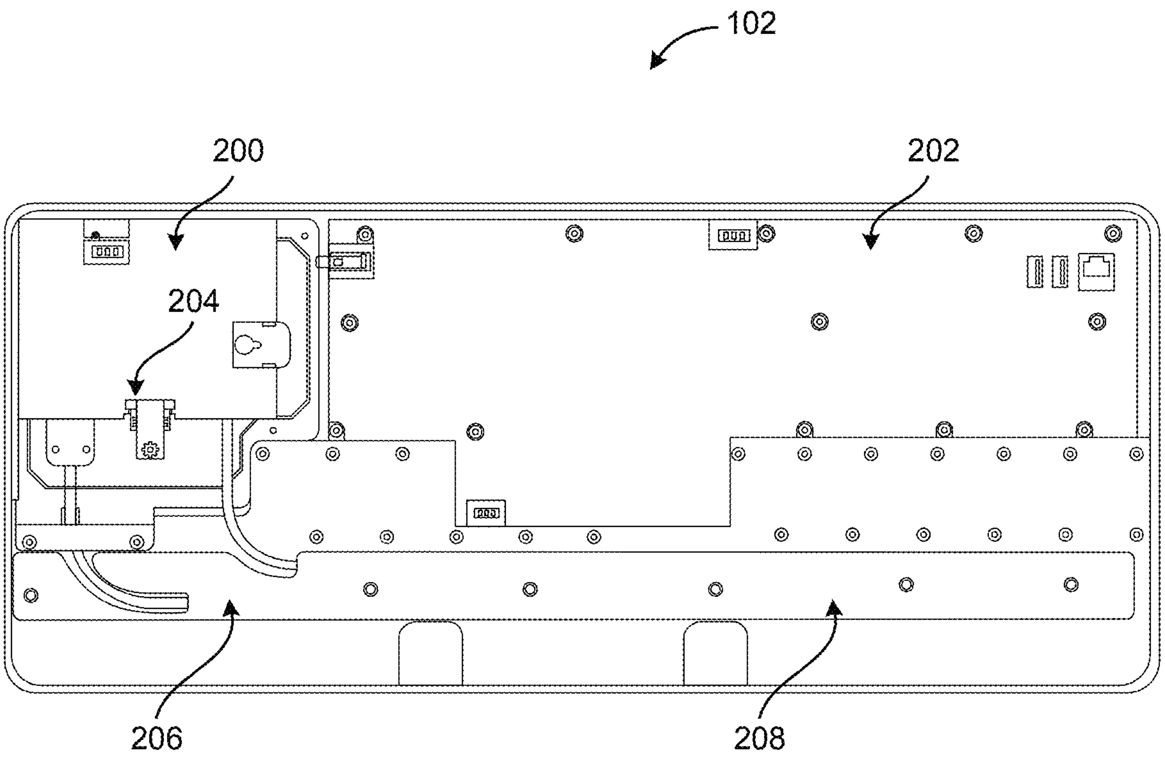
FIG. 2 illustrates one embodiment of the node module assembly of the present disclosure.

FIG. 2 illustrates one embodiment of the node module assembly 200 of the present disclosure. The node module assembly 200 is affixed to the first enclosure member 102, the second enclosure member 104, or another enclosure member within the outdoor enclosure assembly 100, optionally adjacent to other optics 202 within the outdoor enclosure assembly 100. By way of example only, the node module assembly 200 receives and retains a 25 W POM 204 or the like that must be cooled or heated, depending upon the ambient conditions to which the outdoor enclosure assembly 100 is exposed. To assist in cooling the node module assembly 200 and the POM 204, the node module assembly 200 is thermally coupled to one or more heat pipes 206 and a remote heat spreader 208 coupled to the first enclosure member 102, the second enclosure member 104, or another enclosure member and disposed adjacent to the node module assembly and the other optics 202 within the outdoor enclosure assembly 100. It will be readily apparent to those of ordinary skill in the art that the majority of these components may be manufactured from a metallic or other thermally conductive material. The node module assembly 200, heat pipes 206, and remote heat spreader 208 collectively serve to transfer heat between the POM 204 and the outdoor enclosure assembly 100 and, ultimately, the fins 106 and external environment.

Figure 3:
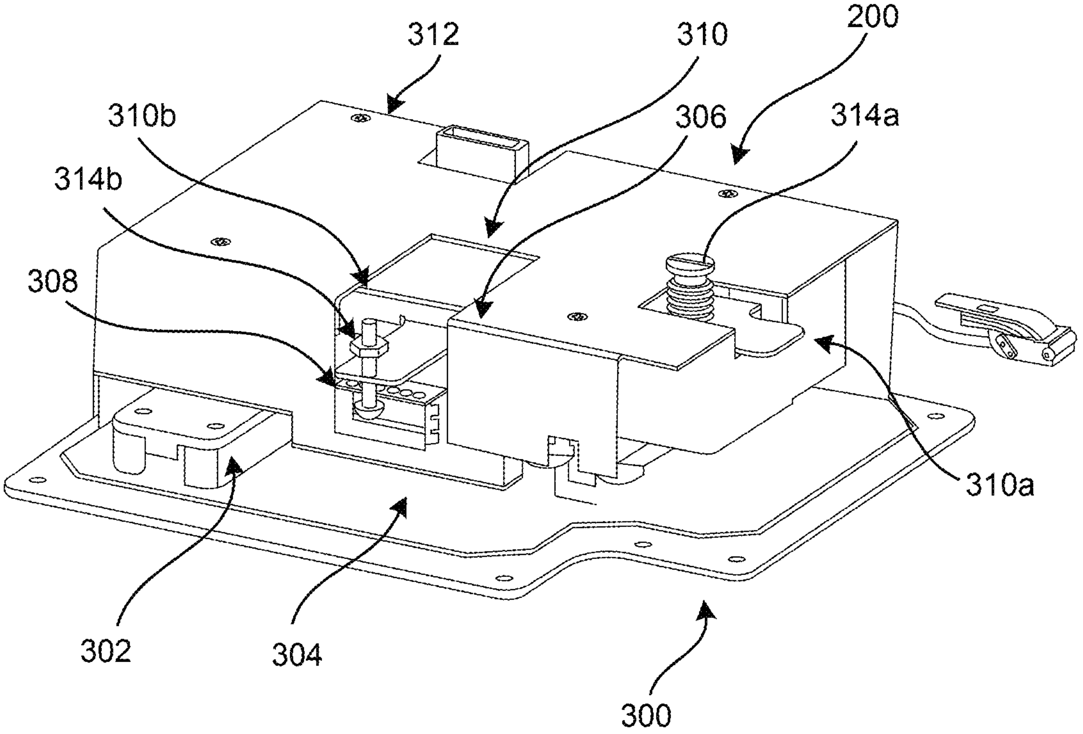
FIG. 3 also illustrates one embodiment of the node module assembly of the present disclosure.
Figure 4:
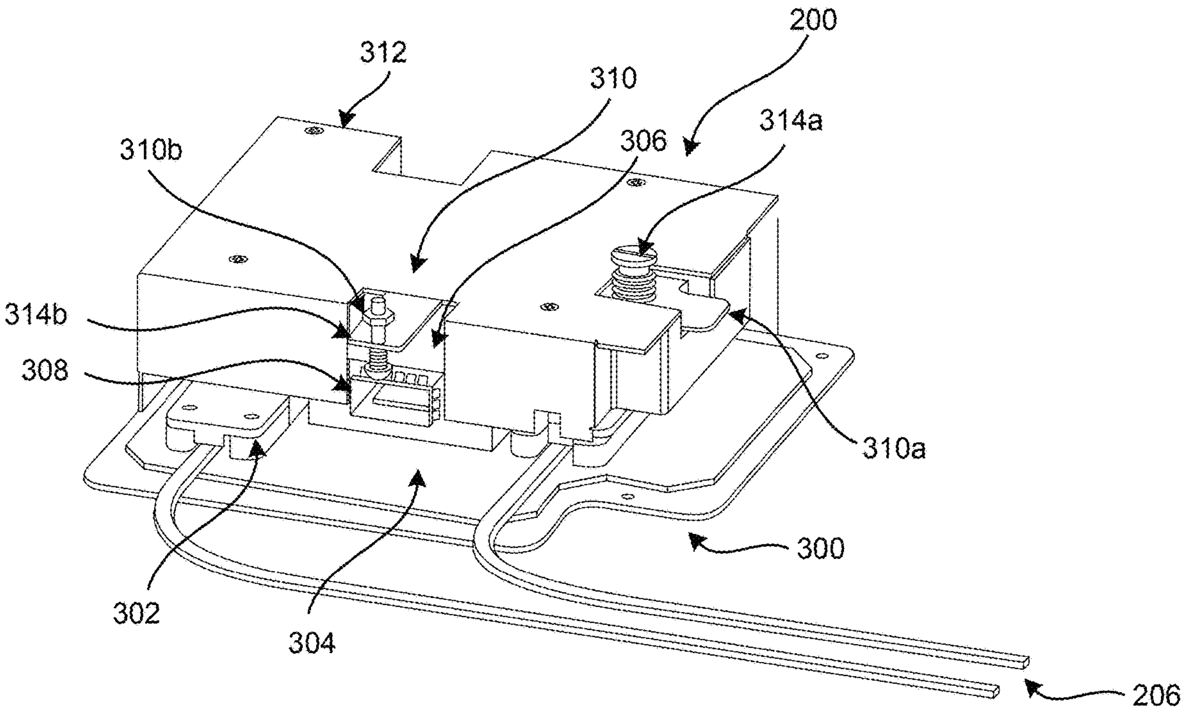
FIG. 4 further illustrates one embodiment of the node module assembly of the present disclosure.

FIGS. 3 and 4 also illustrate one embodiment of the node module assembly 200 of the present disclosure. As is illustrated, the node module assembly 200 includes a VC 300 on which one or more local heat spreaders 302 are disposed. Such VCs 300 are well known to those of ordinary skill in the art and typically include a plurality of thermally conductive layers that define an internal void in which a wicking material and a fluid are disposed. Within the internal void, an evaporation region is formed adjacent to a hot device to be cooled and a condensation region is formed remote from the hot device. Through successive evaporation and condensation cycles, heat is transferred from the hot device to the areas remote from the hot device, with the fluid returned from the condensation region to the evaporation region via the wicking material. Pursuant to the present disclosure, at elevated temperatures, the VC 300 acts to transfer heat from the hot device to the areas remote from the hot device to cool the hot device, while, at low temperatures, the fluid becomes solid and the VC 300 acts as an insulator to keep the hot device warm. The heat pipes 206 are thermally coupled to the local heat spreaders 302 and the VC 300, as well as to the remote heat spreader 208 and the first enclosure member 102, providing an associated heat transfer path to the fins 106 and the external environment.

The node module assembly 200 also includes a local heat spreader plate 304 disposed between the local heat spreaders 302 on the VC 300. As is described in greater detail below, the local heat spreader plate 304 contains and covers the TECs. Adjacent to the local heat spreader plate 304 is the PCBA 306 and the coupled POM cage 308 that selectively receives and retains the POM 204. It should be noted that any number of POMs 204, POM cages 308, local heat spreader plates 304, local heat spreaders 302, heat pipes 206, and the like may be utilized, as desired in a given application. The POM 204 within the POM cage 308 is biased into thermal contact with the local heat spreader plate 304 of the node module assembly 200 by the lever mechanism 310 coupled to the PCBA 306 opposite the local heat spreader plate 304. The lever mechanism 310 is generally covered by a node module cover 312.

The node module cover 312 provides for pass through access for two components of the lever mechanism 310. The lever mechanism 310 includes a first arm member 310*a* that protrudes through the node module cover 312 and allows an operator to manually deflect the lever mechanism 310, the PCBA 306, and the POM cage 308 away from the local heat spreader plate 304. The first arm member 310*a* is biased towards the VC 300 by a first spring assembly 314*a*, such as a first coil spring disposed around a bolt or the like. The lever mechanism 310 also includes a second arm member 310*b* that protrudes through the node module cover 312 and includes a plunger assembly 314*b* that contacts the POM 204 and biases the POM 204 towards and into the local heat spreader plate 304, especially when the lever mechanism 310 is allowed to be biased towards the VC 300. The plunger assembly 314*b* is biased towards the POM 204 by a second coil spring disposed around a bolt or the like. As alluded to above, the plunger assembly 314*b* may include a plastic cap or the like that is actually adhered to the POM 204 using double sided tape or the like. A simple friction contact may also be used.

Thus, the POM cage 308 provides a QSFP-DD slot and the POM 204 may ultimately be cooled by natural convection via the thermal contact with the local heat spreader plate 304 and the VC 300. When the first arm member 310*a* is lifted up by the operator, the PCBA 306, POM cage 308, and POM 204 are lifted away from the local heat spreader plate 304, allowing for safe insertion/removal of the POM 204 without damage to an intervening TIM. The VC 300 is thermally coupled to the chassis 102 locally, and remotely via the heat pipes 206, local heat spreaders 302, and remote heat spreader 208.

Figure 5:
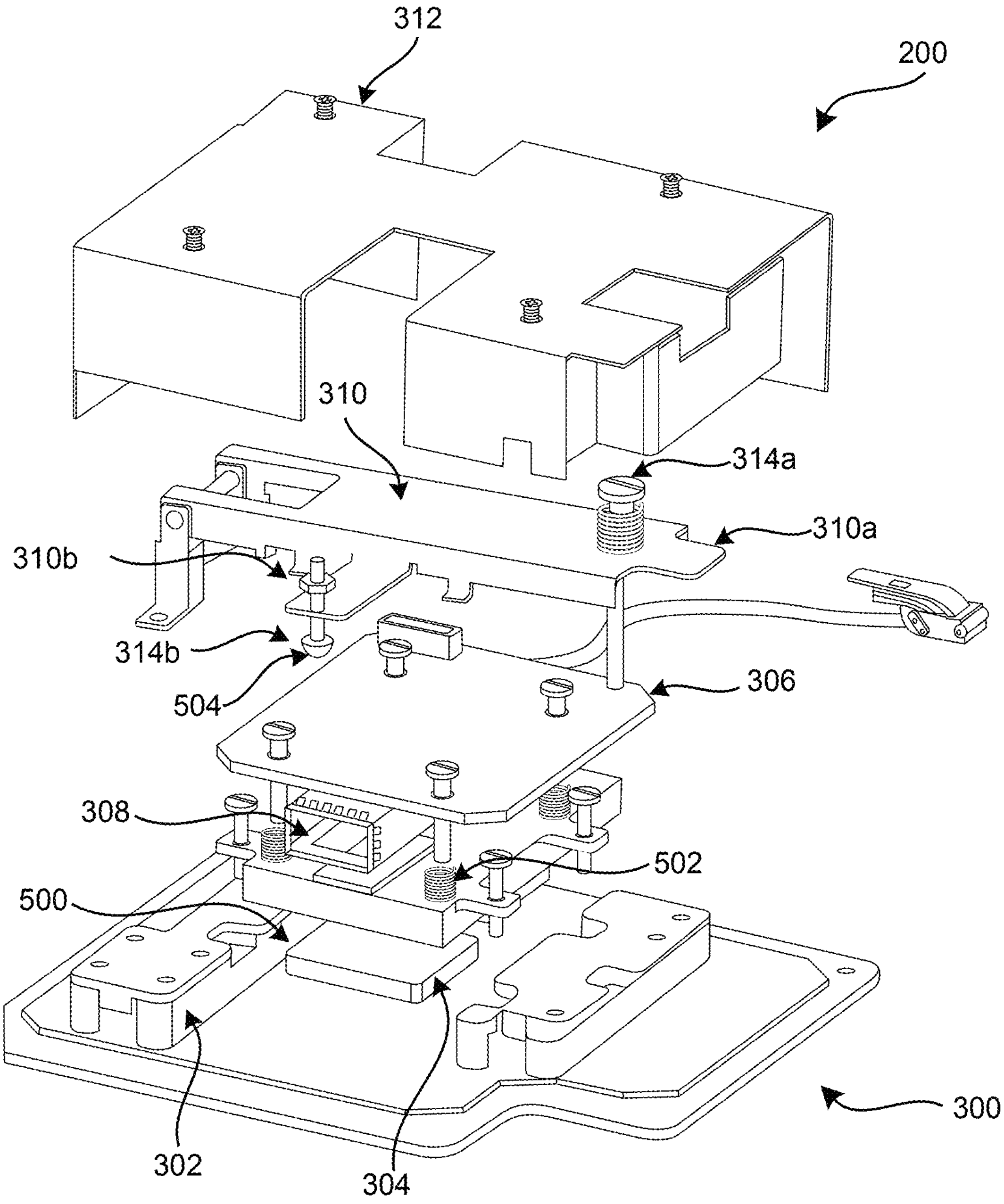
FIG. 5 further illustrates one embodiment of the node module assembly of the present disclosure in an exploded view.

FIG. 5 further illustrates one embodiment of the node module assembly 200 of the present disclosure in an exploded view. As is illustrated, the node module assembly 200 includes the VC 300 on which the one or more local heat spreaders 302 are disposed. Again, such VCs 300 are well known to those of ordinary skill in the art and typically include a plurality of thermally conductive layers that define an internal void in which a wicking material and a fluid are disposed. Within the internal void, an evaporation region is formed adjacent to a hot device to be cooled and a condensation region is formed remote from the hot device. Through successive evaporation and condensation cycles, heat is transferred from the hot device to the areas remote from the hot device, with the fluid returned from the condensation region to the evaporation region via the wicking material. Pursuant to the present disclosure, at elevated temperatures, the VC 300 acts to transfer heat from the hot device to the areas remote from the hot device to cool the hot device, while, at low temperatures, the fluid becomes solid and the VC 300 acts as an insulator to keep the hot device warm. The heat pipes 206 are thermally coupled to the local heat spreaders 302 and the VC 300, as well as to the remote heat spreader 208 and the first enclosure member 102, providing an associated heat transfer path to the fins 106 and the external environment.

The node module assembly 200 also includes the local heat spreader plate 304 disposed between the local heat spreaders 302 on the VC 300. The local heat spreader plate 304 may be a copper heat spreader plate or the like. The local heat spreader plate 304 contains and covers the TECs 500, which may be 25 W each, for example. Adjacent to the local heat spreader plate 304 is the PCBA 306 and the coupled POM cage 308 that selectively receives and retains the POM 204. It should be noted that any number of POMs 204, POM cages 308, local heat spreader plates 304, local heat spreaders 302, heat pipes 206, and the like may be utilized, as desired in a given application. The POM 204 within the POM cage 308 is biased into thermal contact with the local heat spreader plate 304 of the node module assembly 200 by the lever mechanism 310 coupled to the PCBA 306 opposite the local heat spreader plate 304. The lever mechanism 310 is generally covered by the node module cover 312. One or more springs 502 are optionally disposed between the local heat spreader plate 304 and the PCBA 306 to provide a biased separation between these components. It should be noted that all fixedly coupled components may be screwed or bolted together, while all movably coupled components may be joined together via shoulder screws or the like that allow for a degree of relative translation.

The node module cover 312 may be made of sheet metal or the like and provides for pass through access for the two components of the lever mechanism 310. The lever mechanism 310 may also be made of sheet metal or the like and includes the first arm member 310*a* (i.e., tab) that protrudes through the node module cover 312 and allows the operator to manually deflect the lever mechanism 310, the PCBA 306, and the POM cage 308 away from the local heat spreader plate 304. The lever mechanism 310 is pivotably attached to the node module assembly 200 opposite the first arm member 310*a*. The first arm member 310*a* is biased towards the VC 300 by the first spring assembly 314*a*, such as a first coil spring disposed around the shoulder bolt or the like. The lever mechanism 310 also includes the second arm member 310*b* that protrudes through the node module cover 312 and includes the plunger assembly 314*b* that contacts the POM 204 and biases the POM 204 towards and into the local heat spreader plate 304, especially when the lever mechanism 310 is allowed to be biased towards the VC 300. The plunger assembly 314*b* is biased towards the POM 204 by the second coil spring disposed around the shoulder bolt or the like. As alluded to above, the plunger assembly 314*b* may include a plastic cap 504 or the like that is actually adhered to the POM 204 using double sided tape or the like. A simple friction contact may also be used.

Thus, the POM cage 308 provides the QSFP-DD slot and the POM 204 is ultimately be cooled by natural convection via the thermal contact with the local heat spreader plate 304 and the VC 300. When the first arm member 310*a* is lifted up by the operator, the PCBA 306, POM cage 308, and POM 204 are lifted away from the local heat spreader plate 304, allowing for safe insertion/removal of the POM 204 without damage to an intervening TIM. The VC 300 is thermally coupled to the chassis 102 locally, and remotely via the heat pipes 206, local heat spreaders 302, and remote heat spreader 208. It should be noted that other components may be included in the node module assembly 200 of the present disclosure, although not described in greater detail.

Figure 6:
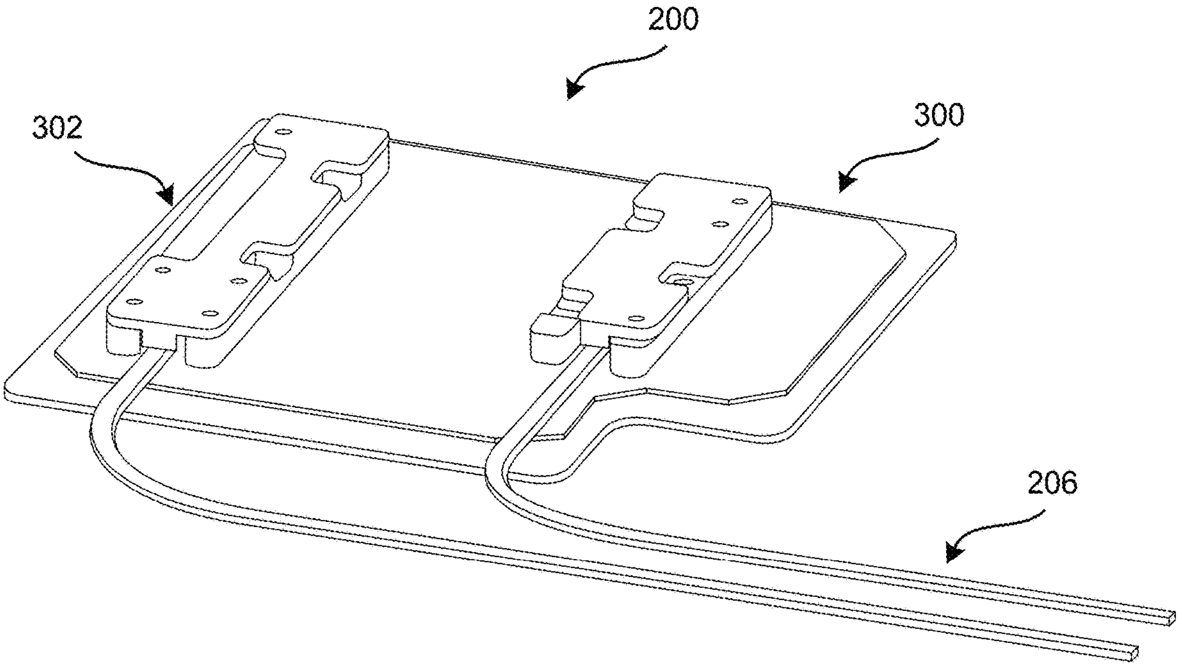
FIG. 6 further illustrates one embodiment of the node module assembly of the present disclosure in a partial view.

FIG. 6 further illustrates one embodiment of the node module assembly 200 of the present disclosure in a partial view. Here, it is shown that the VC 300 is ruggedized and acts as a base for the node module assembly 200 over which the other mechanical and thermal components are in direct contact to transfer heat to the chassis 100. The local heat spreaders 302 act as heat pipe mounting plates to secure the heat pipes 206 to the VC 300 to ensure uniform distribution of heat across the chassis 100. The heat pipes 206 also serve to distribute heat at an offset planar surface, as the VC 300 can be integrated only on a flat planar surface within the chassis 100.

Figure 7:
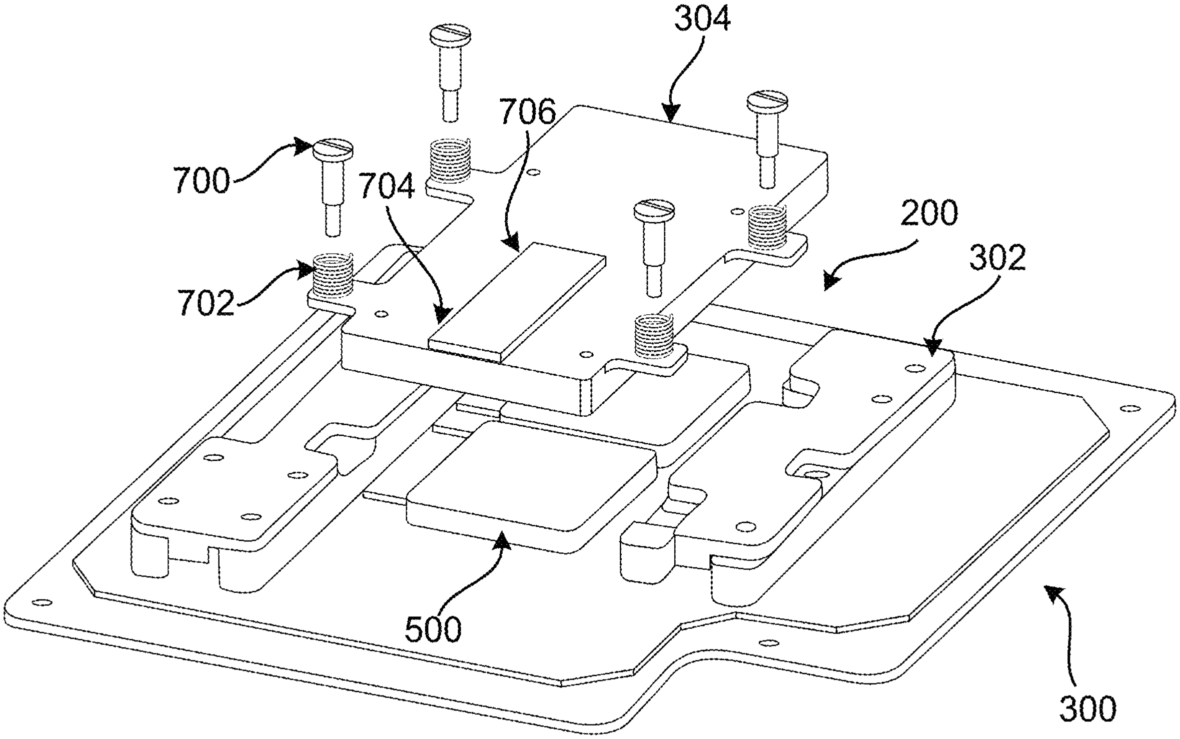
FIG. 7 further illustrates one embodiment of the node module assembly of the present disclosure in a partial view.
Figure 8:
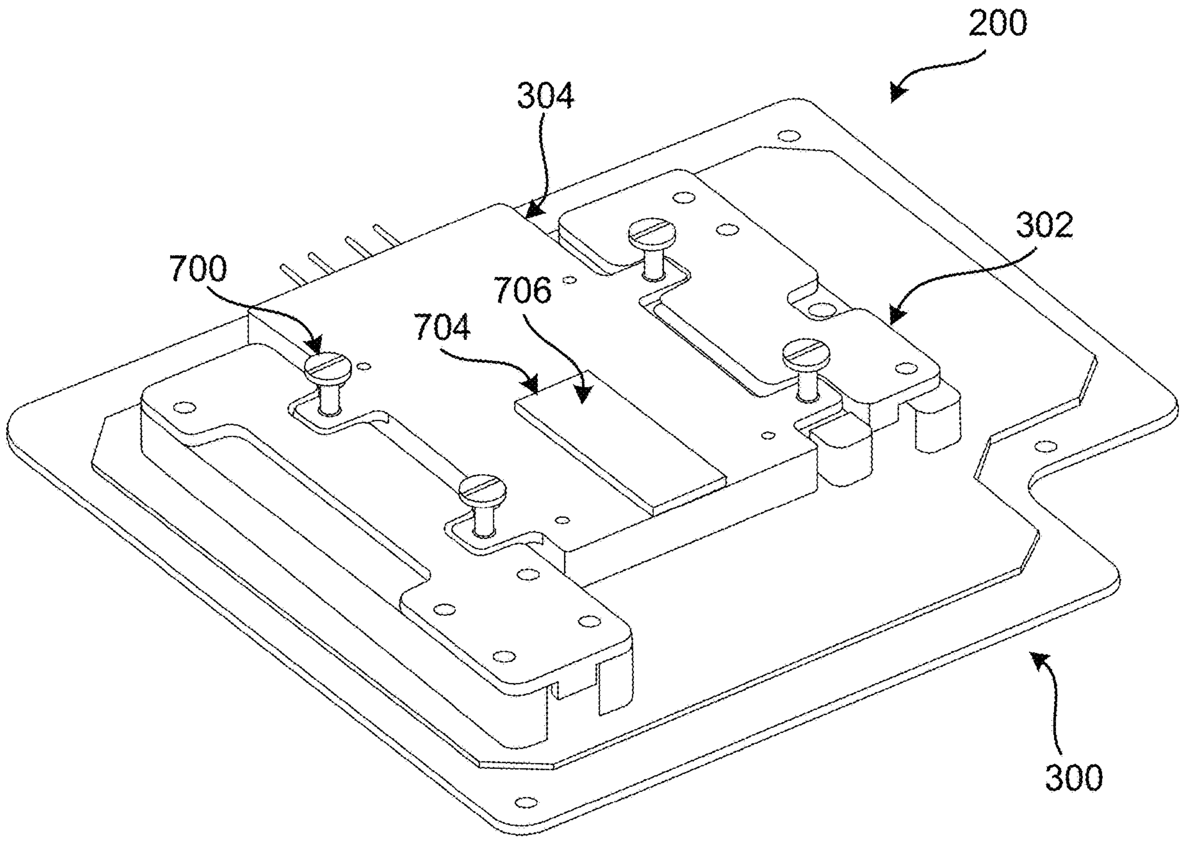
FIG. 8 further illustrates one embodiment of the node module assembly of the present disclosure in a partial view.

FIGS. 7 and 8 further illustrate one embodiment of the node module assembly 200 of the present disclosure in a partial view. As is illustrated, a pair of TECs 500 are sandwiched between the local heat spreader plate 304 and the VC 300 between the local heat spreaders 302, and are optionally disposed within a recess formed in the local heat spreader plate 304. The local heat spreader plate 304 is coupled to the VC 300 around the TECs 500 via a plurality of shoulder screws 700 and optionally biased towards the VC 300 via a plurality of associated coil springs 702. Of note, the PCBA facing surface of the local heat spreader plate 304 includes a protrusion pad 704 that makes physical and thermal contact with the POM 204 through a corresponding cutout of the POM cage 308. Accordingly, the protrusion pad 704 is covered with an intervening TIM 706 to enhance thermal transfer. It is this TIM 706 that the lever mechanism 310 of the present disclosure seeks to protect during POM insertion/removal.

Figure 9:
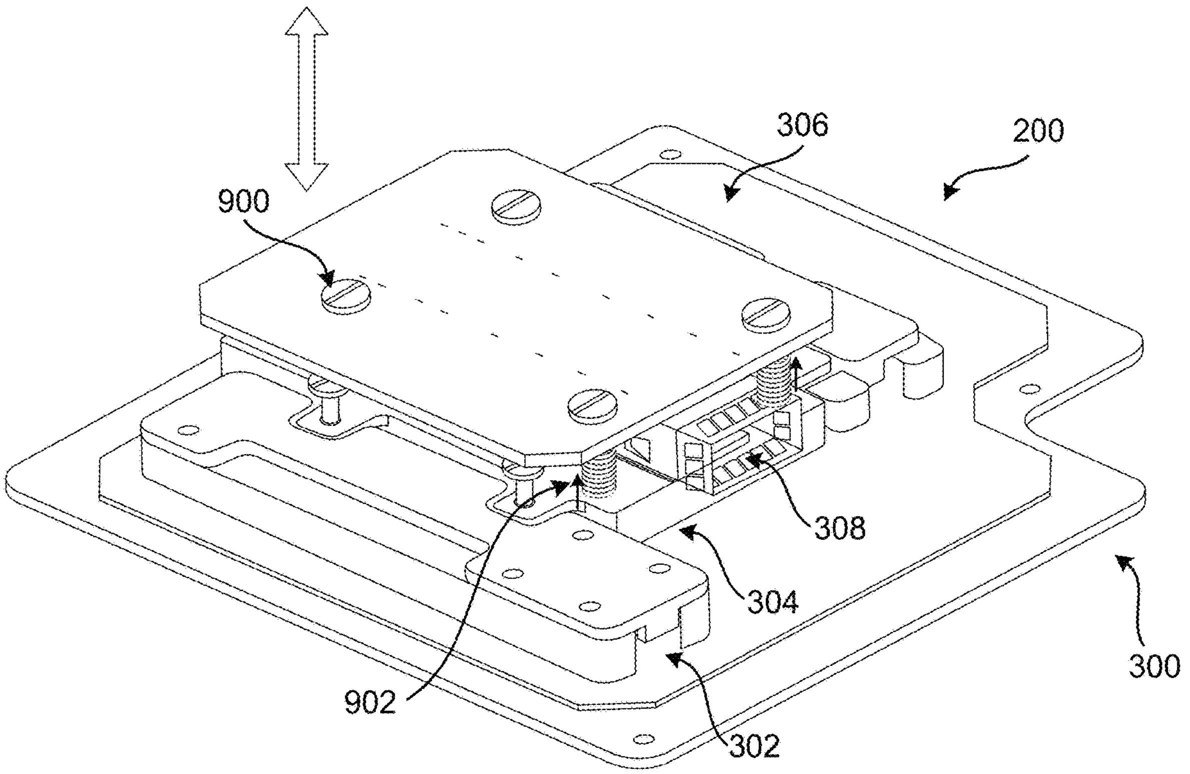
FIG. 9 further illustrates one embodiment of the node module assembly of the present disclosure in a partial view.

FIG. 9 further illustrates one embodiment of the node module assembly 200 of the present disclosure in a partial view. The PCBA 306 is disposed adjacent to the local heat spreader plate 304 via a plurality of shoulder screws 900 and associated coil springs 902 disposed between the local heat spreader plate 304 and the PCBA 306, which serve to bias the PCBA 306 and the POM cage 308 away from the local heat spreader plate 304, again helping to insert/remove the POM 204 without damaging the TIM 706 due to the gap selectively provided between the POM 204 and the TIM 706 disposed on the protrusion pad 704 of the local heat spreader plate 304.

Figure 10:
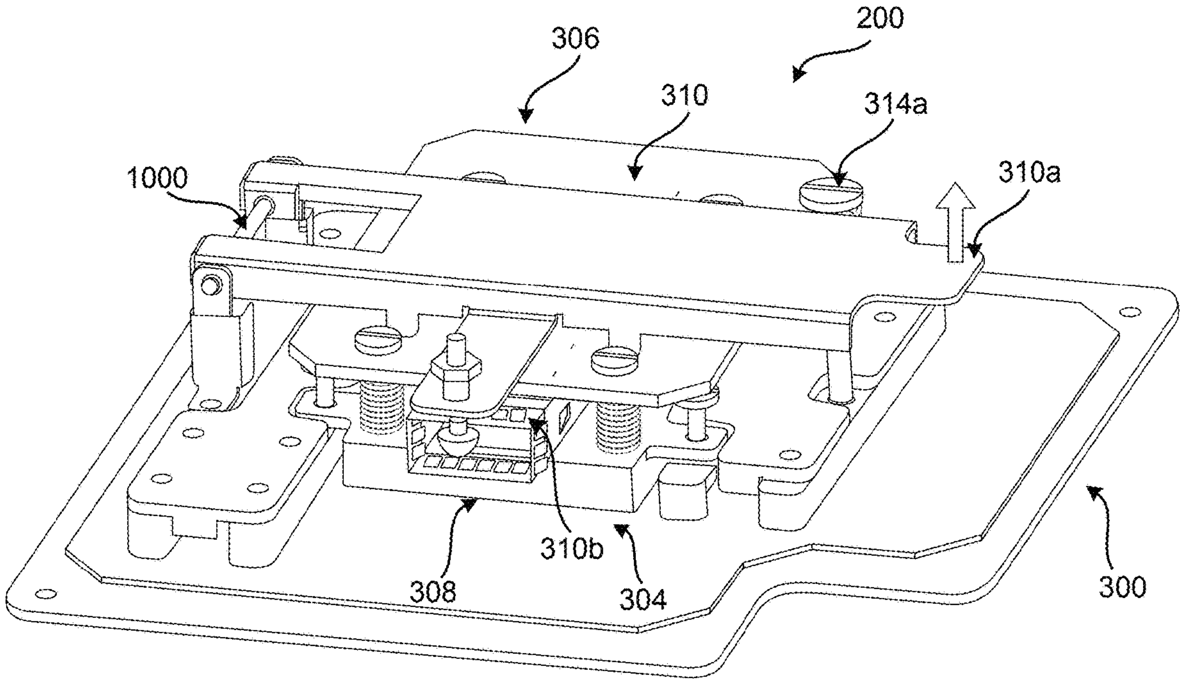
FIG. 10 further illustrates one embodiment of the node module assembly of the present disclosure.

FIG. 10 further illustrates one embodiment of the node module assembly 200 of the present disclosure. As is illustrated, the lever mechanism 310 including the first arm member 310*a* and the second arm member 310*b* is coupled adjacent to the PCBA 306 and is adapted to pivot about a pivot axis 1000. In an unactuated configuration, the lever mechanism 310 presses the PCBA 306 and POM cage 308 into the local heat spreader plate 304, with the POM 204 making thermal contact with the TIM 706 disposed on the protrusion pad 704 of the local heat spreader plate 304 by action of the first spring assembly 314*a* on the lever mechanism 310. When the first arm member 310*a* of the lever mechanism 310 is pulled and actuated by the operator, the PCBA 306 and POM cage 308 are separated from the local heat spreader plate 304, protrusion pad 704, and TIM 706 by a gap, thereby allowing for insertion/removal of the POM 204 into/from the POM cage 308. When the first arm member 310*a* of the lever mechanism 310 is released by the operator, the lever mechanism 310 again presses the PCBA 306 and POM cage 308 into the local heat spreader plate 304, with the POM 204 present making thermal contact with the TIM 706 disposed on the protrusion pad 704 of the local heat spreader plate 304 by action of the first spring assembly 314*a* on the lever mechanism 310.

Figure 11:
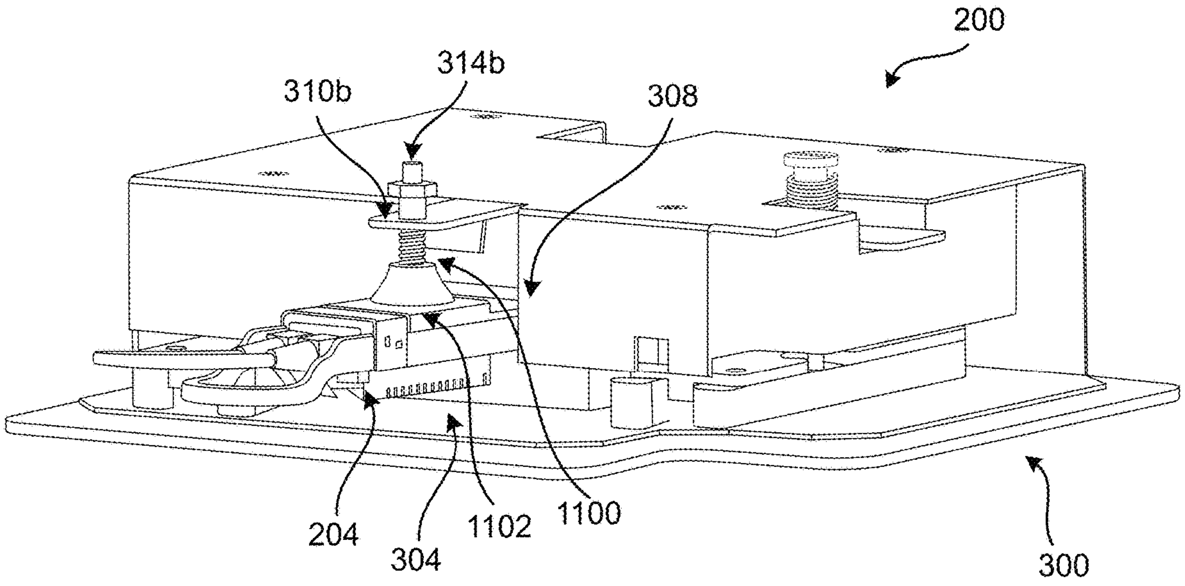
FIG. 11 further illustrates one embodiment of the node module assembly of the present disclosure.

FIG. 11 further illustrates one embodiment of the node module assembly 200 of the present disclosure. Here, the plunger assembly 314*b* coupled to the second arm member 310*b* of the lever mechanism 310 is illustrated, including the coil spring 1100 that biases the plunger cap 1102, which may be a widened plastic or rubber part or the like, into the POM 204. Adhesive tape or the like may be used to couple the plunger cap 1102 to the POM 204, helping to prevent unwanted insertion/removal of the POM 204 into/from the POM cage 308 before the lever mechanism 310 is actuated to separate the POM cage 308 from the local heat spreader plate 304. Appropriate warning labels may also be provided in the vicinity.

Figure 12:
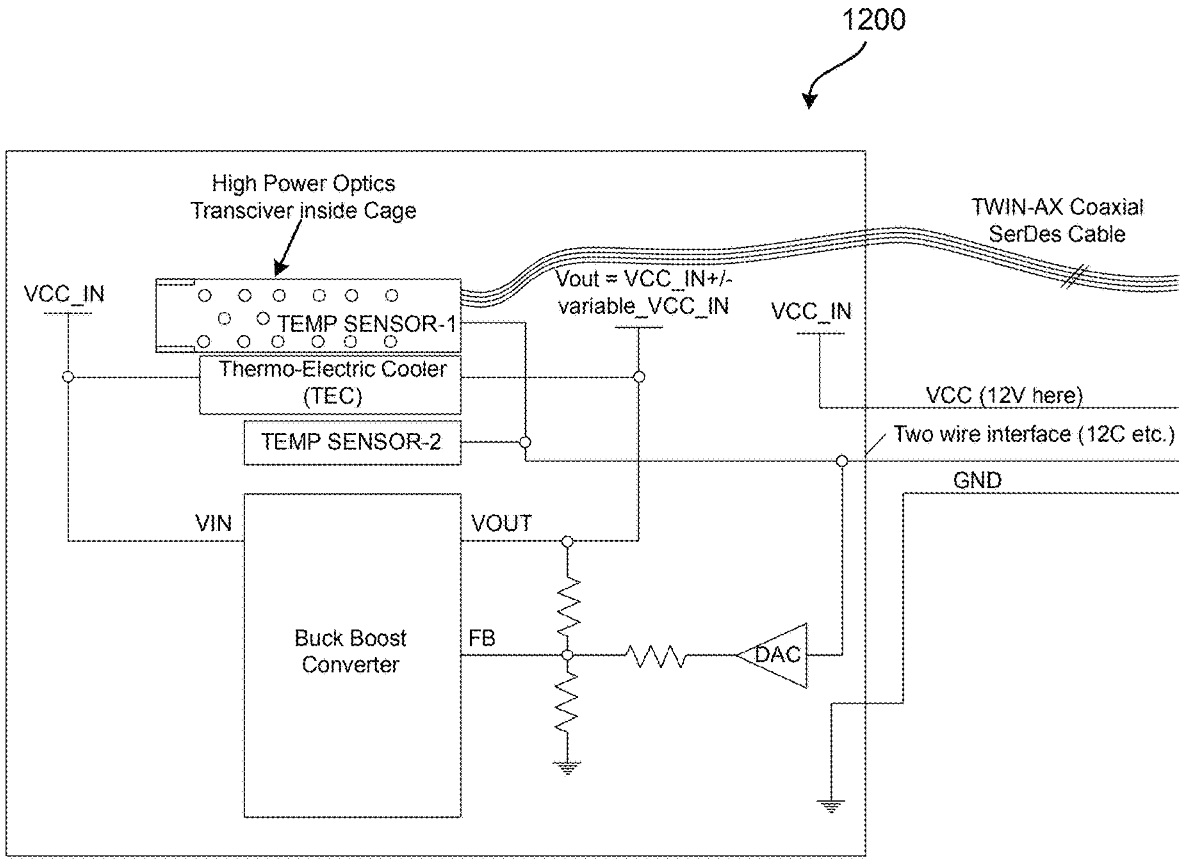
FIG. 12 illustrates one embodiment of a closed loop two wire control circuit for the node module assembly of the present disclosure.

FIG. 12 illustrates one embodiment of a closed loop two wire control circuit 1200 for the node module assembly 200 of the present disclosure. Circuit control can be provided on only two wire interfaces. The same inter-integrated circuit (I2C) line is shared with the optics transceiver 204, where it can access its temperature value (Temp Sensor-1) and optics internal registers, as well as Temp Sensor-2 present on the chassis body and a digital-to-analog controller (DAC) to control the TEC polarity and linear voltage. The DAC changes the dynamic power of TECs to keep the optics transceiver 204 within temperature limits and simultaneously optimize TEC power to save system power. The DAC can change the polarity of the TECs also using the same circuit by changing FB voltage at the buck boost converter, which heats up the optics transceiver module 200 at low ambient temperatures, to keep the optics 204 above 0 degrees C. in the case of commercial optics. If the optics 204 are of industrial grade, the same I2C line reads the optics specifications and the DAC does not heat up the optics 204 and saves power at low ambient temperatures. A twin-ax SerDes cable-based connector cage is used to free this connector, which makes it easy to move when optics 204 are inserted or removed.

A simulation was performed with the node module assembly 200 and 25 W optics 204 at 55 degrees C. ambient temperature in natural convection installed in an outdoor chassis of 230×547 mm with 40 mm fin height. A high temperature TEC was selected to dissipate 25 W heat from the optics 204 to and outdoor chassis 100 in natural convection. In order to dissipate the 25 W from the optics 204 to the outdoor chassis 100, an additional 50 W power was consumed by the TEC. So, in total, 75 W was dissipated from the node module assembly 200. Based on the thermal requirements in this case, the operating current was around 5 amps and the operating voltage was 5 volts. So, a single TEC consumed 25 W and two TECs consumed 50 W power. This was the worst case situation, with TEC power consumption decreasing at lower ambient temperature. As per the simulation results, the node module assembly 200 controls the optics temperature below 70 degrees C., and also maintains the outdoor chassis temp up to 80 degrees C. to keep other major heating components, such as the switch, field programmable gate array (FPGA), etc., on the main board 306 below their specified junction limits.

Thus, the node module assembly 200 of the present disclosure allows the cooling of high power optics 204, 6.5 W and above—for example, 25 W in the present disclosure, as well as heating of such high power optics 204 in low ambient temperature (<0 degrees C., for example), all by means of natural convection, without the use of fans. The node module assembly 200 takes advantage of the spring loaded lever mechanism 310 that presses the PCBA 306 and the one or more POM cages 308 into the local heat spreader plate 304, one or more TECs 500, and VC 300 with an optimized predetermined spring force. Movement of the lever mechanism 310 is restricted when lifted by an operator. The spring loaded lever 310 provides thermal pressure contact between the optics 204 and the ruggedized heat spreader 304 to transfer heat during operation. When the lever 310 is lifted, the TIM 706 on heat spreader 304 is moved away from the optics 204. This avoids scrubbing of the optics 204 with the TIM 706 during insertion/removal of the optics 204. The PCBA 306 that includes the one or more POM cages 308 is spring loaded and lifts away from the one or more TECs 500 when the spring loaded lever 310 is manually actuated upwards. When lever 310 is released, the PCBA 306 and one or more POM cages 308 return to their operation positions. Thus, a gap is created between the optics 204 and the local heat spreader 304 during insertion/removal of the optics 204 and the TIM 706 will not tear or abrade. The one or more TECs 500 are sandwiched between the local heat spreader 304 and the ruggedized VC 300 with optimized spring pressure. This is not impacted by the spring loaded lever 310 during insertion/removal of the optics 204. The mechanism 200 is placed over the VC 300 to spread heat quickly and effectively to the chassis 100. The VC 300 includes a mechanism to mount additional units 200 to transfer and dissipate heat to other parts of the enclosure 100, including the 8 mm heat pipes 206 or the like. A spring biased plunger 314*b* in front of each of the one or more cages 308 prevents inserting the optics 204 unless the operator lifts the lever 310. The plungers 314*b* rest over the optics 204 post insertion utilizing plastic caps 1102 or the like, affixed to the optics 204 using double sided tape or the like. The plungers 314*b* prevent removal of the optics 204 until the operator lifts the spring loaded mechanisms 310.

The ruggedized VC 300, which acts as a heat spreader above 0 degrees C., freezes below 0 degrees C. and behaves as heat insulator. In such situations, the heater 500 over the local spreader plate 304 heats the optics 204 quickly and efficiently, as no or little heat transfers to the outdoor enclosure 100. An intelligent closed loop power controller 1200 is used for the one or more TECs 500 based on the temperature of the optics 204 for the entire ambient range. On the module 200, the full TEC controller 1200 uses two wire communication from a main processor.

Figure 13:
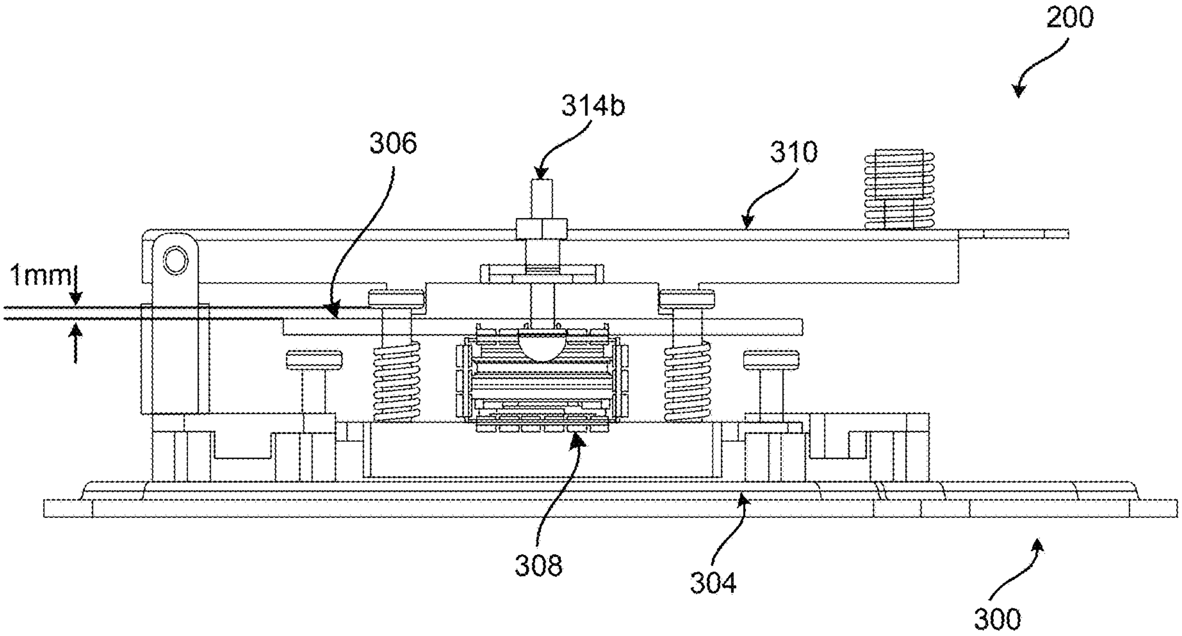
FIG. 13 further illustrates one embodiment of the node module assembly of the present disclosure.

FIG. 13 further illustrates one embodiment of the node module assembly 200 of the present disclosure. The moveable PCBA 306 integrated with a 25 W QSFP-DD POM cage 308 or the like is pressed into the local heat spreader plate 304. Deflection of the PCBA 306 is enabled by actuation of the coupled lever mechanism 310. The lever mechanism 310 is spring loaded to ensure motion of the PCBA 306, the POM cage 308, and the POM 204 against and away from the local heat spreader plate 304 as appropriate. As illustrated, the lever mechanism 310 serves to bias the PCBA 306 towards the local heat spreader plate 304 when "closed", while the PCBA 306 is biased away from the local heat spreader plate 304 by about 1 mm, for example, when the lever mechanism 310 is "open". This gap moves the plunger assembly 314*b* out of the way of the POM cage 308 to a sufficient degree that the POM 204 can be inserted/removed without contacting and abrading the protruding TIM 706 of the local heat spreader plate 304.

Figure 14:
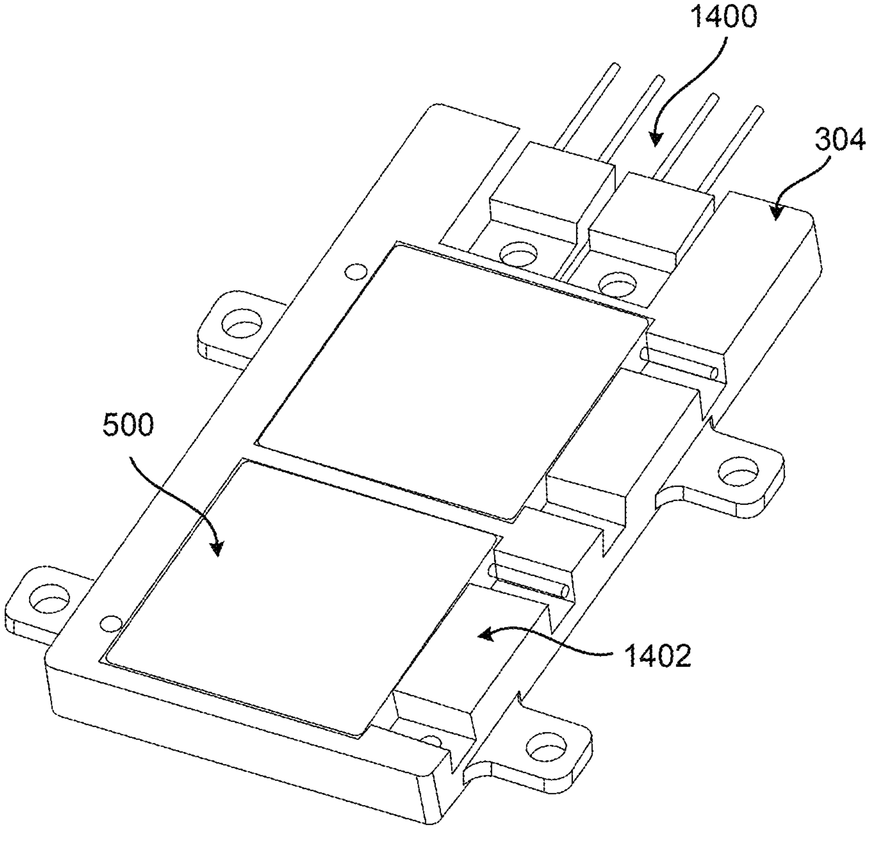
FIG. 14 illustrates one embodiment of the local heat spreader plate of the node module assembly of the present disclosure.

FIG. 14 illustrates one embodiment of the local heat spreader plate 304 of the node module assembly 200 of the present disclosure. The two TECs 500, as well as two heaters 1400, are disposed within a recess 1402 formed in the local heat spreader plate 304, which is disposed adjacent to the VC 300 to provide a conductive path for heat transfer. The cold aspect of each TEC 500 is directed towards the optics side, while the hot aspect of each TEC 500 is directed towards the VC side in hot ambient conditions. Again, heat may be conduited from the VC 300 via the heat pipes 206 and remote heat spreader 208, to the body of the chassis 100. Under cold ambient conditions, the cold aspect of each TEC 500 may be directed towards the VC side, while the hot aspect of each TEC 500 may be directed towards the optics side. For cold ambient conditions (<0 degrees C.), the two heaters 1400 may be utilized at 20 W each, for example. In such conditions, the fluid inside the VC 300 may freeze and the VC 300 acts as an insulator, driving heat to the optics 204, as opposed to the chassis 100. If the heaters 1400 are not utilized, the polarity of each of the TECs 500 may simply be reversed to perform a heating function.

Figure 15:
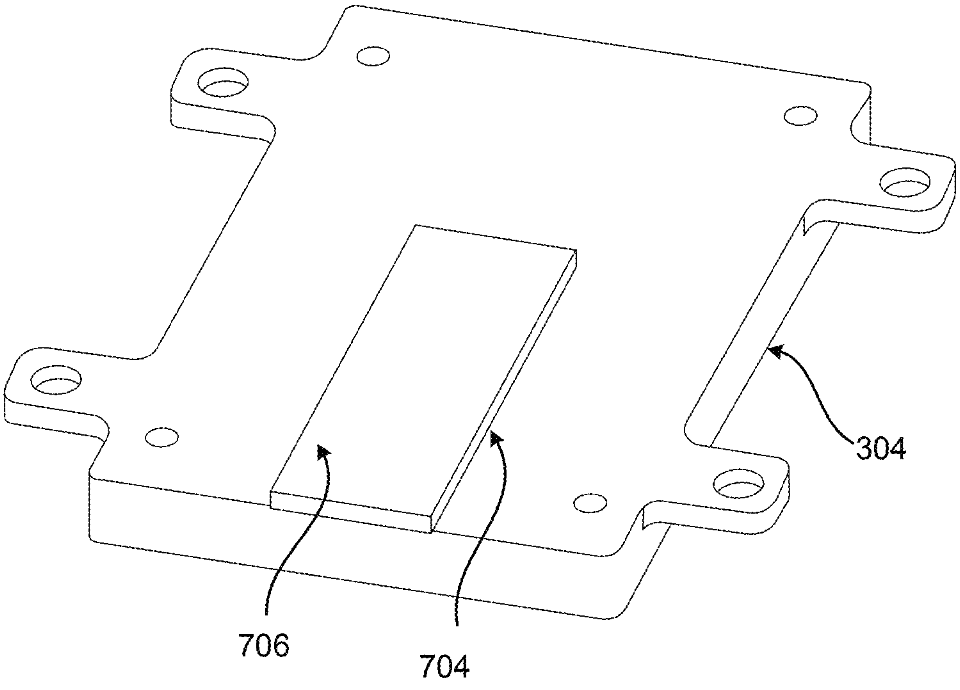
FIG. 15 also illustrates one embodiment of the local heat spreader plate of the node module assembly of the present disclosure.

FIG. 15 also illustrates one embodiment of the local heat spreader plate 304 of the node module assembly 200 of the present disclosure, highlighting the protruding pad 704 and TIM 706 of the local heat spreader plate 304 that provide good thermal contact with the POM 204 when the lever mechanism is in its "retention" configuration.

Figure 16:
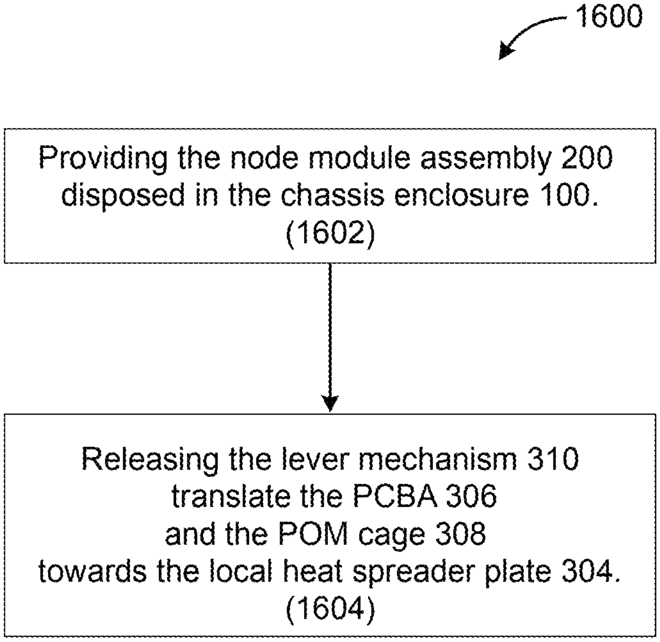
FIG. 16 illustrates one embodiment of the POM cooling/heating method of the present disclosure.

FIG. 16 illustrates one embodiment of the POM cooling/heating method 1600 of the present disclosure. The method 1600 includes providing the node module assembly 200 disposed in the chassis enclosure 100 (1602) and releasing the lever mechanism 310 translate the PCBA 306 and the POM cage 308 towards the local heat spreader plate 304 (1604), the local heat spreader plate 304 thereby being thermally coupled to the POM 204 received in the POM cage 308. The PCBA 306 and POM cage 308 are translated towards/away from the local heat spreader plate 304 by the lever mechanism 310 along an axis disposed perpendicular to a top/bottom/side surface (as opposed to an end surface) of the POM 204. At an elevated ambient temperature, the VC 300 functions as a heat spreader and, at an ambient temperature below freezing, the VC 300 functions as an insulator; and, at the elevated ambient temperature, the TEC 304 functions to cool the POM 204 received in the POM cage 308 and, at the ambient temperature below freezing, the one or more of the TEC 500 and the heater 1400 function to heat the POM 204 received in the POM cage 308.

Although the present disclosure is illustrated and described with reference to specific embodiments and examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A node module assembly adapted to be disposed in a chassis enclosure, the node module assembly comprising:

a local heat spreader plate;

one or more of a thermoelectric cooler and a heater disposed adjacent and thermally coupled to the local heat spreader plate;

a printed circuit board disposed adjacent to the local heat spreader plate;

a pluggable optical mode cage coupled to the printed circuit board and disposed between the local heat spreader plate and the printed circuit board, wherein the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage;

wherein, when the lever mechanism translates the printed circuit board and the pluggable optical module cage towards the local heat spreader plate, the local heat spreader plate is thermally coupled to the pluggable optical module received in the pluggable optical module cage.

2. The node module assembly of claim 1, further comprising:

a vapor chamber disposed adjacent and thermally coupled to the local heat spreader plate opposite the printed circuit board;

wherein the vapor chamber is adapted to function as a heat spreader at an elevated ambient temperature and an insulator at an ambient temperature below freezing.

3. The node module assembly of claim 2, wherein the vapor chamber is thermally coupled to one or more heat pipes thermally coupled to a remote heat spreader thermally coupled to the chassis enclosure adjacent to the node module assembly.

4. The node module assembly of claim 1, wherein the one or more of the thermoelectric cooler and the heater are disposed within a recess formed in the local heat spreader plate.

5. The node module assembly of claim 1, wherein the thermoelectric cooler is coupled to a two wire control circuit and adapted to function in one of a cooling mode to cool the pluggable optical module received in the pluggable optical module cage and a heating mode adapted to heat the pluggable optical module received in the pluggable optical module cage.

6. The node module assembly of claim 1, wherein the printed circuit board is biased away from the local heat spreader plate.

7. The node module assembly of claim 1, wherein the lever mechanism is biased towards the local heat spreader plate and is adapted to bias the printed circuit board towards the local heat spreader plate.

8. The node module assembly of claim 1, wherein the local heat spreader plate comprises a protruding pad that is adapted to thermally contact the pluggable optical module received in the pluggable optical module cage when the lever mechanism translates the printed circuit board and the pluggable optical module cage towards the local heat spreader plate.

9. The node module assembly of claim 8, wherein the protruding pad comprises a thermal interface material that is adapted to thermally and physically contact the pluggable optical module received in the pluggable optical module cage.

10. The node module assembly of claim 1, wherein the lever mechanism comprises a plunger assembly that is adapted to physically contact the pluggable optical module received in the pluggable optical module cage when the lever mechanism translates the printed circuit board and the pluggable optical module cage towards the local heat spreader plate, wherein the plunger assembly is biased towards the pluggable optical module received in the pluggable optical module cage.

11. The node module assembly of claim 1, further comprising a cover disposed about the local heat spreader plate, the printed circuit board, the pluggable optical mode cage, and the lever mechanism, wherein the cover defines a first opening for providing access to a first arm member of the lever mechanism by which an operator can actuate the lever mechanism to translate the printed circuit board and the pluggable optical module cage away from the local heat spreader plate and a second opening for providing access to the pluggable optical module cage for insertion and removal of the pluggable optical module.

12. A chassis enclosure for telecommunications equipment, the chassis enclosure comprising:

an enclosure member; and a node module assembly coupled to the enclosure member and disposed in the chassis enclosure, the node module assembly comprising:

a local heat spreader plate;

one or more of a thermoelectric cooler and a heater disposed adjacent and thermally coupled to the local heat spreader plate;

a printed circuit board disposed adjacent to the local heat spreader plate;

a pluggable optical mode cage coupled to the printed circuit board and disposed between the local heat spreader plate and the printed circuit board, wherein the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage;

wherein, when the lever mechanism translates the printed circuit board and the pluggable optical module cage towards the local heat spreader plate, the local heat spreader plate is thermally coupled to the pluggable optical module received in the pluggable optical module cage.

13. The chassis enclosure of claim 12, wherein the node module assembly further comprises:

a vapor chamber disposed adjacent and thermally coupled to the local heat spreader plate opposite the printed circuit board;

wherein the vapor chamber is adapted to function as a heat spreader at an elevated ambient temperature and an insulator at an ambient temperature below freezing.

14. The chassis enclosure of claim 13, wherein the vapor chamber is thermally coupled to one or more heat pipes thermally coupled to a remote heat spreader thermally coupled to the enclosure member adjacent to the node module assembly.

15. The chassis enclosure of claim 12, wherein the thermoelectric cooler is coupled to a two wire control circuit and adapted to function in one of a cooling mode to cool the pluggable optical module received in the pluggable optical module cage and a heating mode adapted to heat the pluggable optical module received in the pluggable optical module cage.

16. The chassis enclosure of claim 12, wherein:

the printed circuit board is biased away from the local heat spreader plate; and the lever mechanism is biased towards the local heat spreader plate and is adapted to bias the printed circuit board towards the local heat spreader plate.

17. The chassis enclosure of claim 12, wherein the local heat spreader pad comprises a protruding pad comprising a thermal interface material that is adapted to thermally and physically contact the pluggable optical module received in the pluggable optical module cage when the lever mechanism translates the printed circuit board and the pluggable optical module cage towards the local heat spreader plate.

18. The chassis enclosure of claim 12, wherein the lever mechanism comprises a plunger assembly that is adapted to physically contact the pluggable optical module received in the pluggable optical module cage when the lever mechanism translates the printed circuit board and the pluggable optical module cage towards the local heat spreader plate, wherein the plunger assembly is biased towards the pluggable optical module received in the pluggable optical module cage.

19. A method for cooling or heating a pluggable optical module disposed in a chassis enclosure, the method comprising:

providing a node module assembly disposed in the chassis enclosure, the node module assembly comprising:

a local heat spreader plate;

one or more of a thermoelectric cooler and a heater disposed adjacent and thermally coupled to the local heat spreader plate;

a printed circuit board disposed adjacent to the local heat spreader plate;

a pluggable optical mode cage coupled to the printed circuit board and disposed between the local heat spreader plate and the printed circuit board, wherein the pluggable optical module cage is adapted to receive a pluggable optical module; and a lever mechanism coupled to the printed circuit board and adapted to translate the printed circuit board and the pluggable optical module cage towards and away from the local heat spreader plate along an axis perpendicular to a side surface of the pluggable optical module received in the pluggable optical module cage; and releasing the lever mechanism to translate the printed circuit board and the pluggable optical module cage towards the local heat spreader plate, the local heat spreader plate thereby being thermally coupled to the pluggable optical module received in the pluggable optical module cage.

20. The method of claim 19, wherein:

the node module assembly further comprises a vapor chamber disposed adjacent and thermally coupled to the local heat spreader plate opposite the printed circuit board;

at an elevated ambient temperature, the vapor chamber functions as a heat spreader and, at an ambient temperature below freezing, the vapor chamber functions as an insulator; and at the elevated ambient temperature, the thermoelectric cooler functions to cool the pluggable optical module received in the pluggable optical module cage and, at the ambient temperature below freezing, the one or more of the thermoelectric cooler and the heater function to heat the pluggable optical module received in the pluggable optical module cage.

* * * * *